(12) United States Patent
Sohn et al.

(10) Patent No.: US 8,997,340 B2
(45) Date of Patent: Apr. 7, 2015

(54) METHOD OF MANUFACTURING AND INSULATING SHEET

(75) Inventors: Keungjin Sohn, Seongnam-si (KR); Nobuyuki Ikeguchi, Suwon-si (KR); Joung-Gul Ryu, Seoul (KR); Ho-Sik Park, Hwaseong-si (KR); Sang-Youp Lee, Seoul (KR); Joon-Sik Shin, Suwon-si (KR); Jung-Hwan Park, Seongnam-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 777 days.

(21) Appl. No.: 13/137,936

(22) Filed: Sep. 21, 2011

(65) Prior Publication Data

US 2012/0012247 A1 Jan. 19, 2012

Related U.S. Application Data

(62) Division of application No. 12/318,275, filed on Dec. 23, 2008, now abandoned.

(30) Foreign Application Priority Data

Mar. 28, 2008 (KR) .................. 10-2008-0029210

(51) Int. Cl.
*H05K 3/02* (2006.01)
*B32B 37/18* (2006.01)
(Continued)

(52) U.S. Cl.
CPC ......... *B32B 37/185* (2013.01); *B29C 66/73116* (2013.01); *B29C 66/82661* (2013.01); *B32B 3/266* (2013.01); *B32B 15/08* (2013.01); *B32B 27/12* (2013.01); *H05K 1/056* (2013.01); *B29C 66/001* (2013.01); *B29C 66/342* (2013.01); *B29C 66/73111* (2013.01); *B29C 66/73115* (2013.01); *B29C 66/742* (2013.01); *B29C 66/91933* (2013.01); *B29C 66/929* (2013.01);
(Continued)

(58) Field of Classification Search
CPC .................. H05K 3/4641; H05K 2201/0141; H05K 2201/0145; H05K 2201/0278; H05K 2201/0293
USPC .................. 29/825, 830, 932, 840, 832, 846
See application file for complete search history.

(56) References Cited

U.S. PATENT DOCUMENTS 4,814,945 A * 3/1989 Leibowitz .................. 361/792
5,574,630 A 11/1996 Kresge et al.
(Continued)

FOREIGN PATENT DOCUMENTS

JP 53-86365 7/1978
JP 62-65396 3/1987
(Continued)

OTHER PUBLICATIONS

U.S. Patent Final Office Action mailed Mar. 20, 2012 in corresponding U.S. Appl. No. 12/318,275.
(Continued)

*Primary Examiner* — Carl Arbes

(57) ABSTRACT

A method of manufacturing an insulating sheet, the method including providing a reinforcement material having a thermoplastic resin layer stacked thereon; stacking the thermoplastic resin layer stacked on the reinforcement material over a core substrate; and hot pressing the reinforcement material and the thermoplastic resin layer onto the core substrate.

22 Claims, 16 Drawing Sheets

(51) Int. Cl.

| | |
|---|---|
| *B29C 65/00* | (2006.01) |
| *B32B 3/26* | (2006.01) |
| *B32B 15/08* | (2006.01) |
| *B32B 27/12* | (2006.01) |
| *H05K 1/05* | (2006.01) |
| *B29K 67/00* | (2006.01) |
| *B29K 101/12* | (2006.01) |
| *B29K 105/00* | (2006.01) |
| *B29K 105/06* | (2006.01) |
| *B29K 267/00* | (2006.01) |
| *B29K 277/00* | (2006.01) |
| *B29K 305/00* | (2006.01) |
| *B29K 305/02* | (2006.01) |
| *B29K 305/10* | (2006.01) |
| *B29K 305/12* | (2006.01) |
| *B29L 9/00* | (2006.01) |
| *B29L 31/34* | (2006.01) |
| *B32B 38/00* | (2006.01) |
| *H05K 1/03* | (2006.01) |
| *H05K 3/44* | (2006.01) |
| *H05K 3/46* | (2006.01) |

(52) U.S. Cl.
CPC ......... *B29K2067/00* (2013.01); *B29K 2101/12* (2013.01); *B29K 2105/0079* (2013.01); *B29K 2105/06* (2013.01); *B29K 2267/00* (2013.01); *B29K 2277/00* (2013.01); *B29K 2305/00* (2013.01); *B29K 2305/02* (2013.01); *B29K 2305/10* (2013.01); *B29K 2305/12* (2013.01); *B29L 2009/00* (2013.01); *B29L 2009/003* (2013.01); *B29L 2031/3425* (2013.01); *B32B 38/0008* (2013.01); *B32B 2305/08* (2013.01); *B32B 2307/734* (2013.01); *B32B 2310/14* (2013.01); *B32B 2367/00* (2013.01); *B32B 2457/08* (2013.01); *H05K 1/0366* (2013.01); *H05K 3/445* (2013.01); *H05K 3/4608* (2013.01); *H05K 2201/0129* (2013.01); *H05K 2201/0141* (2013.01); *H05K 2201/068* (2013.01); *B29C 66/9141* (2013.01)

(56) References Cited

U.S. PATENT DOCUMENTS

| | | | |
|---|---|---|---|
| 5,919,329 A * | 7/1999 | Banks et al. | 156/281 |
| 6,300,386 B1 | 10/2001 | Karukaya et al. | |
| 6,329,603 B1 | 12/2001 | Japp et al. | |
| 6,673,190 B2 | 1/2004 | Haas et al. | |
| 7,002,080 B2 | 2/2006 | Tani et al. | |
| 7,635,815 B2 * | 12/2009 | Vasoya et al. | 174/255 |
| 7,667,142 B2 * | 2/2010 | Vasoya et al. | 174/255 |
| 7,805,834 B2 | 10/2010 | White et al. | |
| 8,097,335 B2 * | 1/2012 | Vasoya et al. | 174/255 |
| 8,198,551 B2 * | 6/2012 | Japp et al. | 174/262 |
| 2002/0050402 A1 | 5/2002 | Japp et al. | |
| 2002/0172021 A1 | 11/2002 | Seri et al. | |
| 2003/0147227 A1 | 8/2003 | Egitto et al. | |
| 2004/0156583 A1 | 8/2004 | Totani et al. | |
| 2006/0180936 A1 | 8/2006 | Japp et al. | |
| 2008/0010819 A1 | 1/2008 | Nakamura et al. | |

FOREIGN PATENT DOCUMENTS

| | | |
|---|---|---|
| JP | 7-74444 | 3/1995 |
| JP | 10-157010 | 6/1998 |
| JP | 10-296911 | 11/1998 |
| JP | 11-238954 | 8/1999 |
| JP | 2001-177202 | 6/2001 |
| JP | 2002-225029 | 8/2002 |
| JP | 2002225029 | 8/2002 |
| JP | 2004-115961 | 4/2004 |
| JP | 2004-281502 | 10/2004 |

OTHER PUBLICATIONS

U.S. Patent Office Action mailed Sep. 21, 2011 in U.S. Appl. No. 12/318,275.
Korean Office Action issued Dec. 16, 2009 in corresponding Korean Patent Application No. 10-2008-0029210.
Japanese Office Action issued Jan. 18, 2011 and issued in corresponding Japanese Patent Application No. 2008-274652.
U.S. Patent Restriction Requirement, mailed Aug. 3, 2011, issued in corresponding U.S. Appl. No. 12/318,275.
U.S. Appl. No. 12/318,275, filed Dec. 23, 2008, Keungjin Sohn et al., Samsung Electro-Mechanics Co., Ltd.

* cited by examiner

METHOD OF MANUFACTURING AND INSULATING SHEET

CROSS-REFERENCE TO RELATED APPLICATIONS

This application is a U.S. divisional application filed under 37 CFR 1.53(b) claiming priority benefit of U.S. Ser. No. 12/318,275 filed in the United States on Dec. 23, 2008 now abandoned, which claims earlier priority benefit to Korean Patent Application No. 10-2008-0029210 filed with the Korean Intellectual Property Office on Mar. 28, 2008, the disclosures of which are incorporated herein by reference.

BACKGROUND

1. Field

The present invention relates to an insulating sheet and a method of manufacturing the insulating sheet, and to a printed circuit board using the insulating sheet and a method of manufacturing the printed circuit board.

2. Description of the Related Art

Current electronic devices are trending towards smaller, thinner, and lighter products. In step with these trends, the preferred methods for mounting semiconductor chips are changing from wire bonding methods to flip chip methods, which allow greater numbers of terminals. Furthermore, there is a demand also for higher reliability and higher densities in the multi-layer printed circuit board, to which semiconductor chips may be mounted.

In the conventional multi-layer printed circuit board, when glass fiber woven fabric is used for the base material, E-glass fiber, etc., is generally used for the glass fiber component.

A thermosetting resin composition may be impregnated into the glass fiber woven fabric and dried, to produce a B-stage insulation sheet, which can then be processed into a copper clad laminate. This copper clad laminate can be used to fabricate a printed circuit board core, for use in the inner layers, after which B-stage insulation sheets may be arranged and stacked on either side as build-up layers, to manufacture a multi-layer printed circuit board.

In a multi-layer printed circuit board such as that described above, a build-up resin composition may be used in many of the layers, which has a high coefficient of thermal expansion (CTE) (generally about 18 to 100 ppm/° C. in the longitudinal and lateral directions), and a copper (Cu) layer having a coefficient of thermal expansion of about 17 ppm/° C. may be included in each layer. On the outermost layers, solder resist layers may be formed which also have a high rate of thermal expansion (generally about 50 to 150 ppm/° C.). Consequently, the overall coefficient of thermal expansion in the longitudinal and lateral directions for the multi-layer printed circuit board may be about 13 to 30 ppm/° C.

Even in cases where a multi-layer printed circuit board is formed with a resin having high thermal resistance used for the thermosetting resin impregnated into the glass fiber woven fabric, or where an inorganic filler is added to the resin, or a glass fiber woven fabric having a low coefficient of thermal expansion is used as the reinforcement material, the overall coefficient of thermal expansion of the printed circuit board may remain at about 10 to 20 ppm/° C.

The coefficient of thermal expansion of a multi-layer printed circuit board fabricated as above may be much greater than the coefficient of thermal expansion of the semiconductor chip, which is generally about 2 to 3 ppm/° C. With current environmental problems urging the use of lead-free solder in flip chip bonding, this difference can lead to defects reliability tests such as temperature cycle tests, etc. That is, the multi-layer printed circuit board may expand and contract as heat is applied during reliability tests, and the solder and semiconductor chip may be pulled by the expansion and contraction in the longitudinal and lateral directions. As a result, defects may be incurred, such as cracking and delamination in the lead-free solder and damage in the semiconductor chip, etc.

Moreover, in a semiconductor plastic package that has semiconductor chips mounted on one side, the large difference in coefficients of thermal expansion between the semiconductor chips and the multi-layer printed circuit board can lead to significant bending or warpage during the reflowing process.

In an effort to alleviate the stresses when a semiconductor chip is mounted on the multi-layer printed circuit board, a method has been proposed (e.g. Japanese Patent Publication No. 2001-274556) of forming organic insulation layers that have a low coefficient of thermal expansion in the outermost layers of the multi-layer printed circuit board, which has a coefficient of thermal expansion of about 13 to 20 ppm/° C. This publication specifically discloses a multi-layer printed circuit board that uses for the thermally alleviating organic insulation layer a prepreg made by impregnating a thermosetting resin into a reinforcement material of aramid fiber woven fabric, which has a coefficient of thermal expansion of about 9 ppm/° C.

The publication, however, does not provide detailed reliability test results. Also, when a thermally alleviating organic insulation sheet, of 6 to 12 ppm/° C., is used for manufacturing a printed circuit board, the high coefficient of thermal expansion of the inner core printed circuit board may lead to the thermally alleviating organic insulation sheet being pulled and stretched, resulting in the overall coefficient of thermal expansion of the integrated multi-layer printed circuit board exceeding 10 ppm/° C.

When a reliability test, such as a temperature cycle test, etc., is performed for a multi-layer printed circuit board manufactured as above with semiconductor chips mounted using lead-free solder, it may be shown that the organic insulation sheet intended to serve as a thermal buffer may be largely ineffective, because the difference in the rate of thermal expansion between the semiconductor chips and the integrated multi-layer printed circuit boards may cause defects such as cracking and delamination in the lead-free solder connecting the semiconductor chips.

There is also a printed circuit board that uses a metal plate core made of invar or copper-invar, where a B-stage thermosetting resin composition, such as epoxy resin, etc., may be stacked over the metal plate.

In this type of printed circuit board, the difference in coefficients of thermal expansion between the stacked resin layer and the low CTE metal plate core may be extremely large. Thus, when a stress is applied to the printed circuit board, such as during the cutting of the printed circuit board, the resin layer may be delaminated from the metal core, and the reliability of the printed circuit board may be degraded.

Also, as semiconductor chips are mounted on a printed circuit board in higher densities, defects may be incurred by the heat generated by the semiconductor chips.

SUMMARY

An aspect of the invention provides is to provide an insulating sheet and a method of manufacturing the insulating sheet, as well as a printed circuit board using the insulating sheet and a method of manufacturing the printed circuit board, which can be utilized to prevent damage to and delamination of the semiconductor chip and lead-free solder, etc., prevent bending and warpage in the printed circuit board, and provide a heat-releasing effect in the semiconductor plastic package.

One aspect of the invention provides a method of manufacturing an insulating sheet that includes: providing a reinforcement material on which a thermoplastic resin layer is stacked, stacking the thermoplastic resin layer stacked on the reinforcement material over a core substrate, and hot pressing the reinforcement material and the thermoplastic resin layer onto the core substrate.

The coefficient of thermal expansion of the core substrate in the longitudinal and lateral directions can be within a range of −20 to 9 ppm/° C. The core substrate can include materials such as copper, iron, nickel, magnesium, cobalt, tungsten, titanium, and aluminum.

The coefficient of thermal expansion of the reinforcement material in the longitudinal and lateral directions can be within a range of −20 to 9 ppm/° C. The reinforcement material can include materials such as organic fibers and inorganic fibers. Examples of organic fibers may include aromatic polyamide fibers, polybenzoxazole fibers, and liquid crystal polyester fibers, while examples of inorganic fibers may include glass fibers.

The coefficient of thermal expansion of the thermoplastic resin layer in the longitudinal and lateral directions can be within a range of −20 to 9 ppm/° C. The thermoplastic resin layer can include liquid crystal polyester resin.

The reinforcement material may have a fusion point higher than that of the thermoplastic resin layer.

In certain embodiments, the method of manufacturing an insulating sheet can include, before the stacking of the thermoplastic resin layer, selectively perforating at least one through-hole in the core substrate.

Another aspect of the invention provides an insulating sheet that includes: a reinforcement material, a thermoplastic resin layer stacked over the reinforcement material, and a core substrate stacked such that one side of the core substrate faces the thermoplastic resin layer.

The coefficient of thermal expansion of the core substrate in the longitudinal and lateral directions can be within a range of −20 to 9 ppm/° C.

Similarly, the coefficient of thermal expansion of the reinforcement material in the longitudinal and lateral directions can be within a range of −20 to 9 ppm/° C., and the coefficient of thermal expansion of the thermoplastic resin layer in the longitudinal and lateral directions can be within a range of −20 to 9 ppm/° C.

The thermoplastic resin layer can include, for example, liquid crystal polyester resin.

The reinforcement material may have a fusion point higher than that of the thermoplastic resin layer.

At least one through-hole can be selectively perforated in the core substrate.

The insulating sheet can further include other thermoplastic resin layers, which may be stacked over both sides of another reinforcement material and stacked over the other side of the core substrate.

Still another aspect of the invention provides a method of manufacturing a printed circuit board that includes: providing a reinforcement material on either side of which a thermoplastic resin layer is stacked, stacking the thermoplastic resin layer stacked on either side of the reinforcement material over a core substrate, hot pressing the reinforcement material and the thermoplastic resin layers onto the core substrate, and forming a circuit pattern over the exposed thermoplastic resin layer.

The coefficient of thermal expansion of the core substrate in the longitudinal and lateral directions can be within a range of −20 to 9 ppm/° C. The core substrate can include materials such as copper, iron, nickel, magnesium, cobalt, tungsten, titanium, and aluminum.

The coefficient of thermal expansion of the reinforcement material in the longitudinal and lateral directions can be within a range of −20 to 9 ppm/° C. The reinforcement material can include materials such as organic fibers and inorganic fibers. Examples of organic fibers may include aromatic polyamide fibers, polybenzoxazole fibers, and liquid crystal polyester fibers, while examples of inorganic fibers may include glass fibers.

The coefficient of thermal expansion of the thermoplastic resin layer in the longitudinal and lateral directions can be within a range of −20 to 9 ppm/° C. The thermoplastic resin layer can include liquid crystal polyester resin.

The reinforcement material may have a fusion point higher than that of the thermoplastic resin layer.

The method of manufacturing a printed circuit board can include, before the stacking of the thermoplastic resin layer, selectively perforating at least one through-hole in the core substrate.

Yet another aspect of the invention provides a printed circuit board that includes: a reinforcement material, a thermoplastic resin layer stacked over either side of the reinforcement material, a core substrate stacked such that one side of the core substrate faces the thermoplastic resin layer, and a circuit pattern formed over the exposed thermoplastic resin layer.

The coefficient of thermal expansion of the core substrate in the longitudinal and lateral directions can be within a range of −20 to 9 ppm/° C.

Similarly, the coefficient of thermal expansion of the reinforcement material in the longitudinal and lateral directions can be within a range of −20 to 9 ppm/° C., and the coefficient of thermal expansion of the thermoplastic resin layer in the longitudinal and lateral directions can be within a range of −20 to 9 ppm/° C.

The thermoplastic resin layer can include, for example, liquid crystal polyester resin.

The reinforcement material may have a fusion point higher than that of the thermoplastic resin layer.

At least one through-hole can be selectively perforated in the core substrate.

The printed circuit board can further include other thermoplastic resin layers, which may be stacked over both sides of another reinforcement material and stacked over the other side of the core substrate.

Additional aspects and advantages of the present invention will be set forth in part in the description which follows, and in part will be obvious from the description, or may be learned by practice of the invention.

BRIEF DESCRIPTION OF THE DRAWINGS

FIG. 1 is a flowchart illustrating a method of manufacturing an insulating sheet according to an embodiment of the invention.

DESCRIPTION OF EMBODIMENTS

Figure 1:
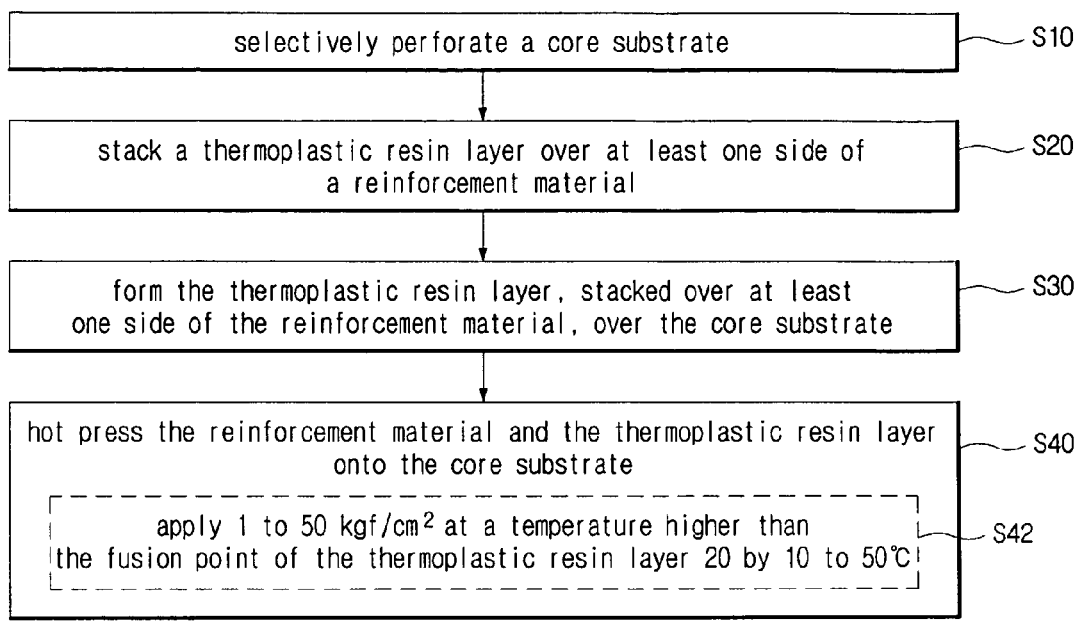
FIG. 1 is a perspective view illustrating a 명칭 according to a first embodiment of the invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

Certain embodiments of the present invention will be described below in detail with reference to the accompanying drawings.

FIG. 2 through FIG. 5 are cross sectional views representing a flow diagram for a method of manufacturing an insulating sheet according to an embodiment of the invention. In FIG. 2 through FIG. 5, there are illustrated reinforcement materials 10, thermoplastic resin layers 20, and a core substrate 30.

The method of manufacturing an insulating sheet according to this embodiment can include stacking a thermoplastic resin layer over at least one side of a reinforcement material, forming the thermoplastic resin layer, which is stacked over at least one side of the reinforcement material, over a core substrate, and then hot pressing the reinforcement material and the thermoplastic resin layer onto the core substrate.

Figure 2:
FIG. 2, FIG. 3, FIG. 4, and FIG. 5 are cross sectional views representing a flow diagram for a method of manufacturing an insulating sheet according to an embodiment of the invention.
Figure 3:
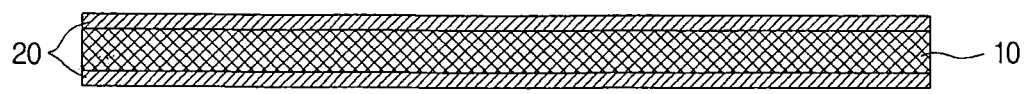

For this, the reinforcement material 10 can first be formed, as illustrated in FIG. 2, and a thermoplastic resin layer 20 can be stacked over at least one side of the reinforcement material 10. In this particular embodiment, thermoplastic resin layers 20 can be stacked over both sides of the reinforcement material 10, as illustrated in FIG. 3.

Here, the coefficient of thermal expansion of the reinforcement material 10 in the longitudinal and lateral directions can be within a range of −20 to 9 ppm/° C. The reinforcement material 10 can include woven or non-woven fabric made of organic or inorganic fibers.

The inorganic fibers are not limited to particular types, and may include, for example, E-glass, D-glass, NE-glass, T-(S-) glass fibers, etc., formed into a woven or non-woven fabric.

The organic fibers are not limited to particular types either, and low CTE organic fibers may generally be used that have a coefficient of thermal expansion within the range of −20 to 9 ppm/° C. For example, aromatic polyamide fibers, polybenzoxazole fibers, liquid crystal polyester fibers, etc., can be formed into a woven or non-woven fabric.

The polybenzoxazole can include, for example, polyimide benzoxazole, poly-paraphenylene benzobisoxazole, etc. The aromatic polyamide can include, for example, poly-metaphenylene isophthalamide, co-poly-(paraphenylene/3,4'-oxydiphenylene terephthalamide), etc.

Here, at the maximum temperature reached when mounting components onto a printed circuit board, which is about 260° C., the aromatic polyamide fibers or polybenzoxazole fibers may not melt and thus may not pose a problem. However, certain liquid crystal polyester fibers may have a fusion point close to 260° C., so that when these fibers are used in the reinforcement material 10, the reinforcing effect may be degraded. Therefore, in cases where liquid crystal polyester fibers are used in the reinforcement material 10, it can be advantageous to use fibers that have a fusion point higher by 10° C. or more than the fusion point of the thermoplastic resin layers 20 stacked over the reinforcement material 10.

Furthermore, a low CTE film having a coefficient of thermal expansion of −20 to 9 ppm/° C. in the longitudinal and lateral directions, such as a polyimide film, an aromatic polyamide film, a polybenzoxazole film, and a liquid crystal polyester film having a fusion point higher than that of the liquid crystal polyester resin layers 20 stacked on, can be used for the reinforcement material 10.

In order to improve the adhesion between the reinforcement material 10 and the resin layers, a known surface treatment can be applied to the reinforcement material 10, examples of which include applying a silane coupling agent, plasma treatment, corona treatment, various chemical treatment, and blast treatment, etc.

The reinforcement material 10 is not limited to a particular thickness. However, a thickness between 4 and 200 μm, and in certain cases between 10 and 150 μm, can be advantageous.

The thermoplastic resin layers 20 are not limited to a particular type. In certain examples, the coefficient of thermal expansion of the thermoplastic resin layers 20 in the longitudinal and lateral directions can be within a range of −20 to 9 ppm/° C. In describing this particular embodiment, liquid crystal polyester resin will be used as an example of a thermoplastic resin layer 20. The thermoplastic resin layers 20 can be selected such that the fusion point of the reinforcement material 10 is higher than the fusion point of the thermoplastic resin layers 20.

The liquid crystal polyester resin layers 20, used as specific examples in this embodiment, are not limited to a particular type. In certain examples, the coefficient of thermal expansion of the liquid crystal polyester resin layers 20 can be between −20 and 9 ppm/° C. In consideration of environmental problems, it can be advantageous not to include halogen elements in the molecules of the liquid crystal polyester resin layers. The molecular structure is not limited to a particular type, and the molecular structure can be designed such that the coefficient of thermal expansion is 9 ppm/° C. or lower. The resin can be used dissolved in a solvent or in a sheet.

Adequate amounts of various additives can be added to the liquid crystal polyester resin, to such a degree that the desired properties of the resin remain unaltered. For example, any of various thermosetting resins, thermoplastic resins, or other resins, and any of various known additives such as organic/inorganic fillers, dyes, pigments, thickening agents, antifoaming agents, dispersing agents, brightening agents, etc., can be added to form the liquid crystal polyester resin layers 20.

The method of attaching the liquid crystal polyester resin layers 20 onto the reinforcement material 10 of inorganic or organic fibers according to an embodiment of the invention is not limited to a particular type. In certain examples, a liquid crystal polyester resin can be dissolved in an organic solvent (such as N-methyl-2-pyrrolidone, etc.), to which adequate amounts of suitable additives can be added and evenly dispersed. Using a process of continuously precipitating and drying this solution dispersed throughout the reinforcement material 10 and evaporating the solvent, the reinforcement material can be impregnated, to manufacture an insulating sheet for a printed circuit board.

When an organic film is used, as another form of organic reinforcement material 10, a solution in which the liquid crystal polyester resin is dispersed can be coated using a roller, etc., over at least one side of the film, to which a surface treatment has been applied, and afterwards the solution can be dried and the solvent evaporated. The liquid crystal polyester resin layer 20 can be formed over one or either side of the organic film to manufacture the insulating sheet.

In certain examples, a film prepared beforehand by extrusion molding or casting, etc., can be arranged on one or either side of the organic film, and a detachable film or a metal plate can be arranged on the outer side. These materials can be heated and pressed in a vacuum, to fuse and attach the liquid crystal polyester resin composition and thus manufacture an insulating sheet for a printed circuit board.

In certain examples, the liquid crystal polyester resin composition can be arranged on one or either side of an inorganic or organic reinforcement material, and detachable films or metal plates can be arranged on the outer sides. Afterwards, heat and pressure can be supplied to the configuration in a vacuum environment at a temperature 10 to 50° C. higher than the fusion point of the liquid crystal polyester resin, in order that the liquid crystal polyester resin may be impregnated into the reinforcement material, and an insulating sheet may be manufactured for use in a printed circuit board.

The thickness of the liquid crystal polyester resin 20, as measured from the reinforcement material 10, is not limited to a particular value, but may generally be between 5 to 100 μm. In addition, the total thickness of the liquid crystal polyester resin layer, including the reinforcement material 10, is not limited to a particular value, but may generally be 20 to 500 μm, or in some cases 30 to 200 μm.

Figure 4:
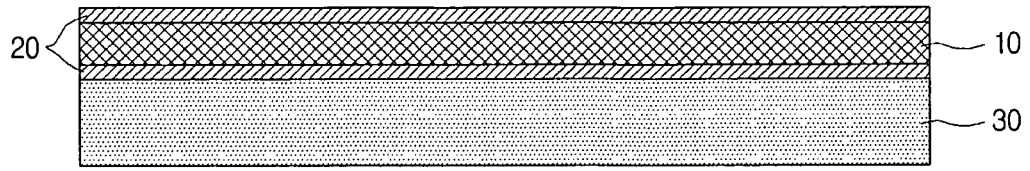

Next, as illustrated in FIG. 4, the thermoplastic resin layer 20 stacked over the reinforcement material 10 can be formed over one side of a core substrate 30, and the reinforcement material 10 and the thermoplastic resin layer 20 can be attached to the core substrate 30 by hot pressing. Here, the fusion point of the reinforcement material 10 can be higher than that of the thermoplastic resin layer 20, and the hot pressing can be performed at a temperature higher than the fusion point of the thermoplastic resin layer 20 by 10 to 50° C. with a pressure of 1 to 50 kgf/cm2. The degree of vacuum can advantageously be made 10 mmHg or lower.

The coefficient of thermal expansion of the core substrate 30 in the longitudinal and lateral directions can be within a range of −20 to 9 ppm/° C. The core substrate is not limited to a particular material, and various known metals, such as copper, iron, nickel, magnesium, cobalt, tungsten, titanium, aluminum, etc., or an alloy of such metals can be used. It is also possible to use a nickel-iron type alloy or a nickel-iron-cobalt type alloy, etc. In particular, in cases where the main purpose of the printed circuit board is to allow high-frequency uses, rather than to provide a low coefficient of thermal expansion, a typical electro-deposited copper foil or a rolled copper foil may also be used. In cases where the main purpose is to provide a low CTE (coefficient of thermal expansion) printed circuit board, a multi-layer metal can be used, such as copper/invar/copper, etc., in which a layer of copper is attached to at least one side of a nickel-iron type or nickel-iron-cobalt type alloy.

A degree of roughness can be provided on one side of the core substrate 30 on which to attach the resin composition, or a certain other type of surface treatment can be applied. A treatment method known to those skilled in the art can be used for the surface treatment. For example, if a multi-layer metal (e.g. copper/invar/copper, etc.) is used, the resin composition can be attached after applying a known method such as a black oxide treatment, brown oxide treatment, and a chemical treatment, etc., to the surface of the copper layer.

Figure 5:
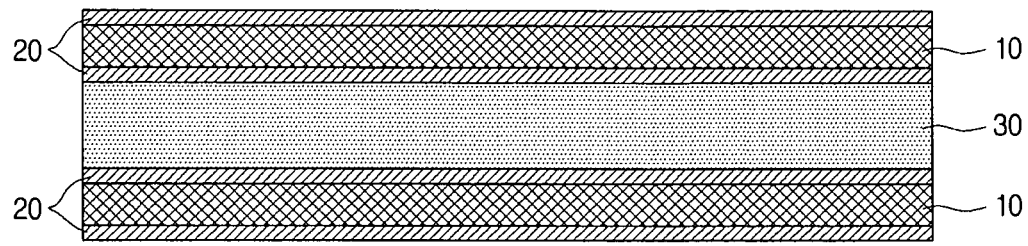

Of course, the thermoplastic resin layers 20 having reinforcement materials 10 attached thereto can be formed over both sides of the core substrate 30, as illustrated in FIG. 5.

FIG. 1 is a flowchart illustrating a method of manufacturing an insulating sheet according to an embodiment of the invention, and FIG. 6 through FIG. 9 are cross sectional views representing a flow diagram for a method of manufacturing an insulating sheet according to another embodiment of the invention.

In FIG. 6 through FIG. 9, there are illustrated reinforcement materials 10, thermoplastic resin layers 20, a core substrate 32, and through-holes 34. This embodiment is substantially the same as the embodiment illustrated by FIGS. 2 to 5, with the difference lying only in the structure of the core substrate 32. As such, the descriptions will focus mainly on this difference.

Figure 6:
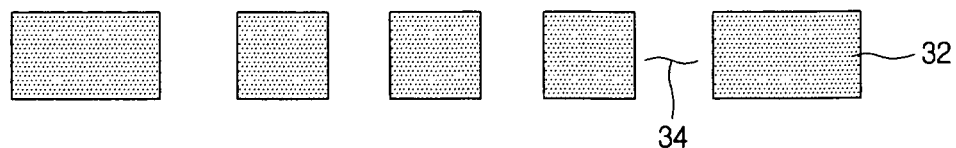
FIG. 6, FIG. 7, FIG. 8, and FIG. 9 are cross sectional views representing a flow diagram for a method of manufacturing an insulating sheet according to another embodiment of the invention.

To implement this embodiment, first, through-holes can be selectively formed in the core substrate 32 (810), as illustrated in FIG. 6. The through-holes in the core substrate 32 may be formed beforehand or may be formed after the stacking and molding procedures as through-holes or blind via holes.

In cases where the reinforcement material 10 is a woven fabric, non-woven fabric, or film made of aromatic polyamide or polybenzoxazole, since the fusion point of the stacked liquid crystal polyester resin composition may be between 200 to 300° C., the layers may be stacked and molded by applying heat and pressure in a vacuum environment at a temperature higher than the fusion point by about 10 to 50° C. Of course, it is also possible to perform the stacking at a temperature higher than the fusion point of the liquid crystal polyester resin by more than 50° C. However, if the stacking temperature is too high, the viscosity of the fused resin may be excessively lowered, so that the resin may flow over the sides, and the thickness of the metal clad laminate may become uneven. This unevenness can be a cause of bending or warpage, and can result in unevenness in the insulating property of the printed circuit board. On the other hand, if the stacking temperature is lower than the fusion point of the liquid crystal polyester resin composition, the resin may not be able to fuse and hence may not be impregnated into the reinforcement material, and because air may remain, voids may be more likely to occur during the stacking. In particular, when an inorganic filler, etc., is added, voids may remain inside the configuration after the stacking.

Figure 7:
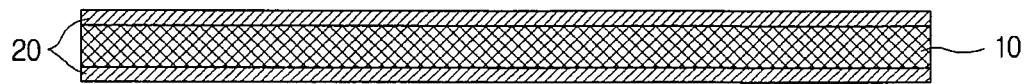

Next, as illustrated in FIG. 7, the thermoplastic resin layers 20 may be stacked over both sides of the reinforcement materials 10 (S20). The thermoplastic resin layer 20 can be stacked over at least one side of the reinforcement material 10.

Figure 8:
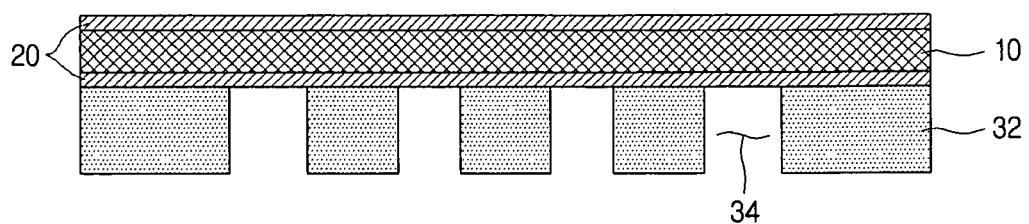
Figure 9:
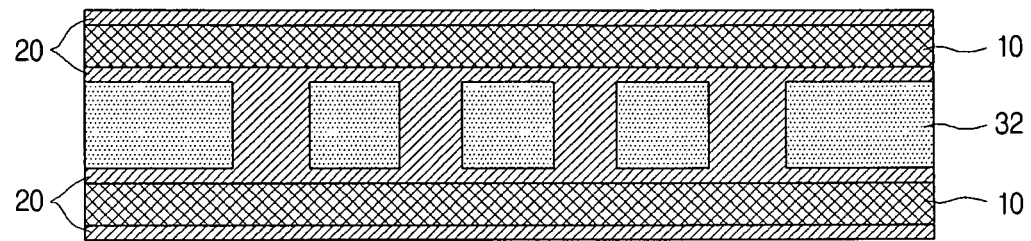

Next, the thermoplastic resin layers 20 stacked over a reinforcement material 10 can be formed over one side of the core substrate 32, as illustrated in FIG. 8, and the thermoplastic resin layers 20 stacked over a reinforcement material 10 can be stacked over the other side of the core substrate 32, as illustrated in FIG. 9. In other words, the thermoplastic resin layers 20 stacked over the reinforcement materials 10 can be formed over both sides of the core substrate 32 (S30).

The reinforcement materials 10 and the thermoplastic resin layers 20 can be attached to the core substrate 32 by hot pressing (S40), which can be performed at a temperature higher than the fusion point of the thermoplastic resin layers 20 by about 10 to 50° C. with a pressure of 1 to 50 kgf/cm2. (S42). The degree of vacuum can advantageously be made 10 mmHg or lower.

Figure 10:
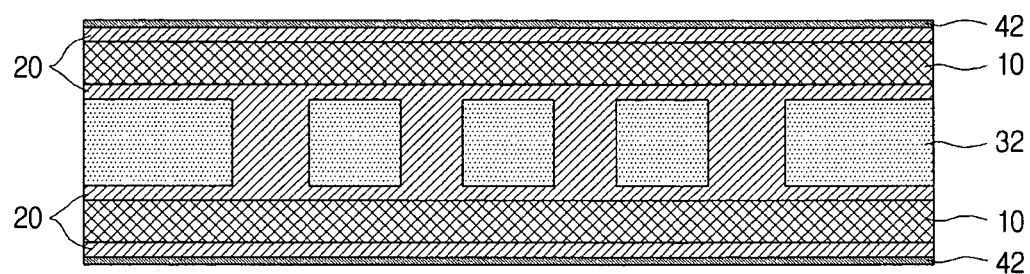
FIG. 10, FIG. 11, and FIG. 12 are cross sectional views representing a flow diagram for a method of manufacturing a semiconductor plastic package using an insulating sheet according to an embodiment of the invention.
Figure 11:
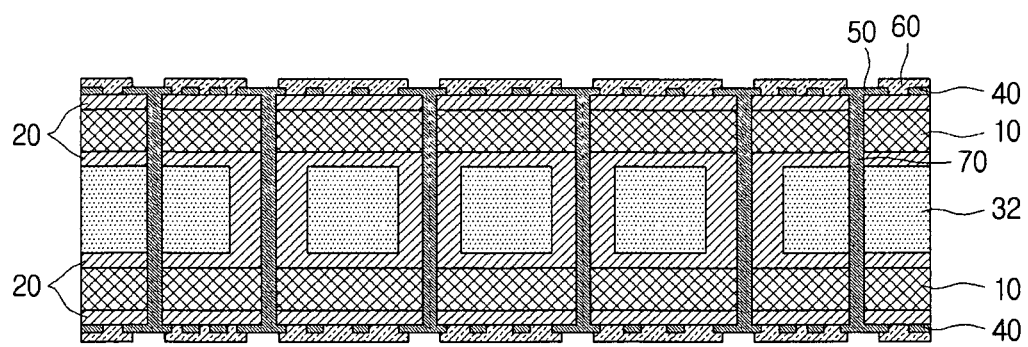
Figure 12:
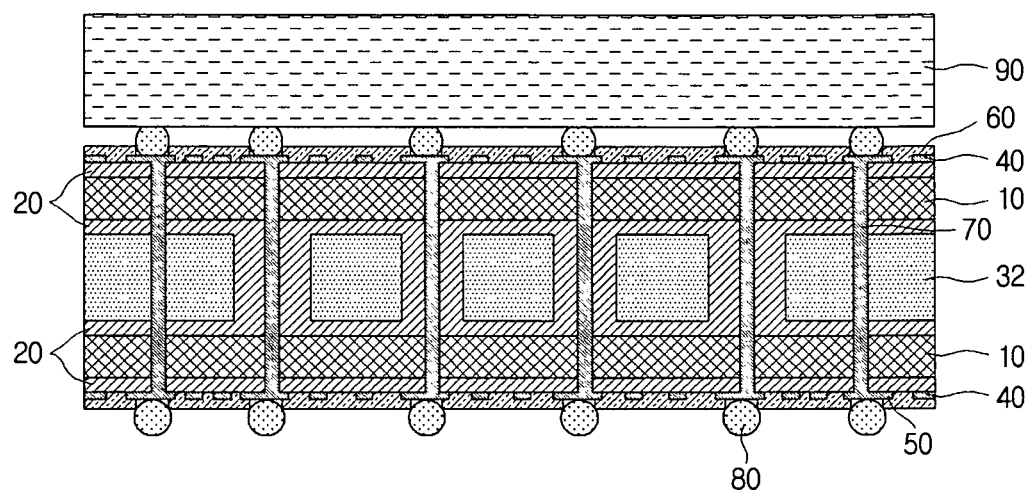
Figure 13:
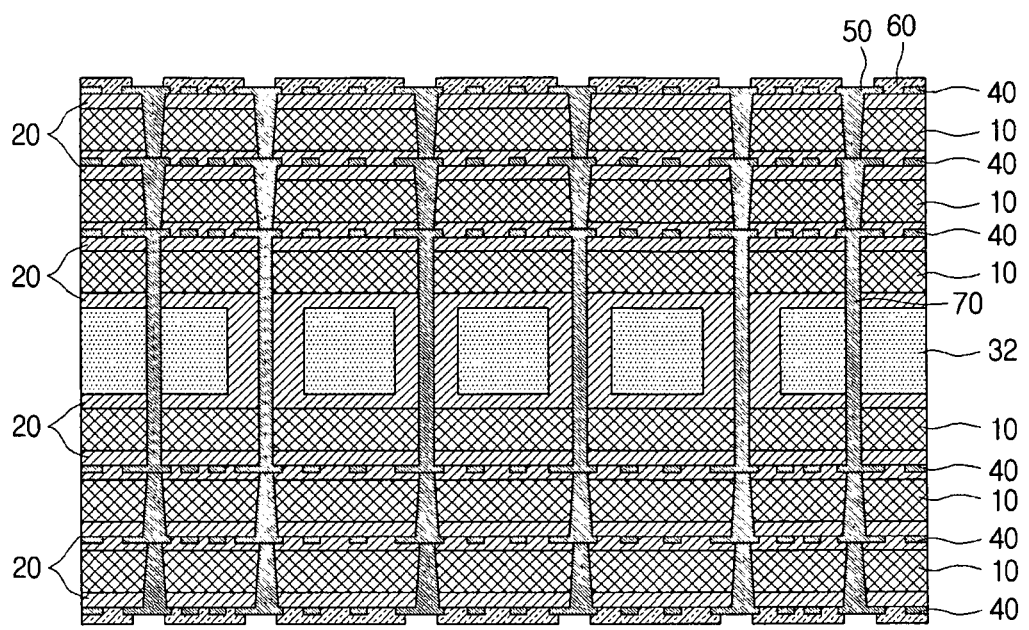
FIG. 13 and FIG. 14 are cross sectional views representing a flow diagram for a method of manufacturing a multi-layer semiconductor plastic package using an insulating sheet according to an embodiment of the invention.
Figure 14:
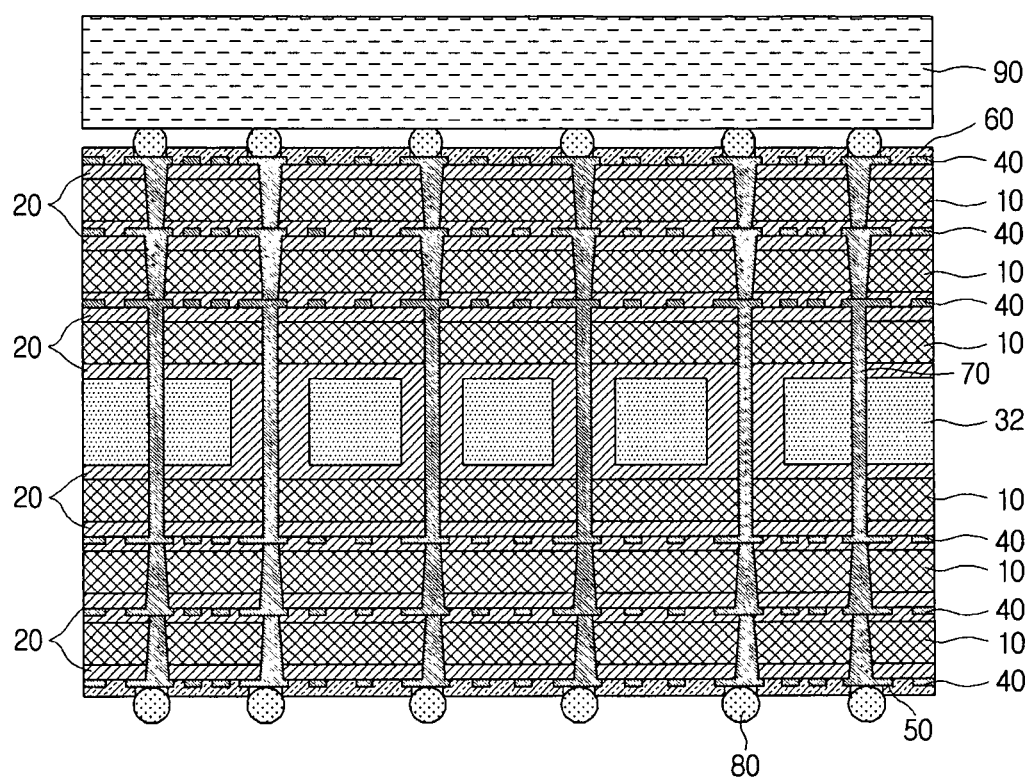

FIG. 10 through FIG. 12 are cross sectional views representing a flow diagram for a method of manufacturing a semiconductor plastic package using an insulating sheet according to an embodiment of the invention, while FIG. 13 and FIG. 14 are cross sectional views representing a flow diagram for a method of manufacturing a multi-layer semiconductor plastic package using an insulating sheet according to an embodiment of the invention. In FIGS. 10 to 14, there are illustrated reinforcement materials 10, thermoplastic resin layers 20, a core substrate 32, circuit patterns 40, metal layers 42, lands 50, solder resists 60, vias 70, solder balls 80, and a semiconductor chip 90.

In the description for this embodiment, a via 70 may refer to a portion that electrically connects circuit patterns formed on the printed circuit board.

This embodiment is described for a method of forming a semiconductor plastic package using insulation sheets manufactured according to the processes illustrated in FIGS. 6 to 9.

As illustrated in FIG. 10, metal layers 42 can be stacked over the outermost thermoplastic resin layers 20. A metal layer 42 attached thus to the thermoplastic resin layer 20 formed on the reinforcement material 10 can include any of various known metals, such as copper, iron, nickel, magnesium, cobalt, tungsten, titanium, aluminum, etc., or an alloy of such metals.

In cases where the main purpose of the printed circuit board is to allow high-frequency uses, rather than to provide a low coefficient of thermal expansion, a typical electroplated copper foil or a rolled copper foil can be used for the metal layer 42. In cases where the main purpose is to provide a printed circuit board having a coefficient of thermal expansion of 9 ppm/° C. or lower, a multi-layer metal can be used, such as copper/invar/copper. That is, a nickel-iron type or nickel-iron-cobalt type alloy can be attached together with layers of copper over at least one side.

If the reinforcement material used has a sufficiently low coefficient of thermal expansion, a printed circuit board having a coefficient of thermal expansion of 9 ppm/° C. or lower may still be obtained even when using a copper layer for the metal core substrate. A degree of roughness can be provided on the surface of the metal core substrate to which the resin composition will be attached, or a certain other type of surface treatment can be applied. A treatment method known to those skilled in the art can be used for the surface treatment. For example, if a multi-layer metal (e.g. copper/invar/copper, etc.) is used, a known method of black oxide treatment, brown oxide treatment, chemical treatment, etc., can be applied to the surface of the copper layer.

In this particular embodiment, the metal layer 42 can be arranged over at least one side of an organic fiber reinforcement material 10 for use in a printed circuit board. In cases where the reinforcement material 10 is a woven fabric, non-woven fabric, or film made of aromatic polyamide or polybenzoxazole, since the fusion point of the stacked liquid crystal polyester resin composition may be between 200 to 300° C., the layers may be stacked and molded by applying heat and pressure in a vacuum environment at a temperature higher than the fusion point by about 10 to 50° C.

Of course, it is also possible to perform the stacking at a temperature higher than the fusion point of the liquid crystal polyester resin by more than 50° C. However, if the stacking temperature is too high, the viscosity of the fused resin may be excessively lowered, so that the resin may flow over the sides, and the thickness of the metal clad laminate may become uneven. This unevenness can be a cause of bending or warpage, and can result in unevenness in the insulating property of the printed circuit board. On the other hand, if the stacking temperature is lower than the fusion point of the liquid crystal polyester resin composition, the resin may not be able to fuse and hence may not be impregnated into the reinforcement material, and because air may remain, voids may be more likely to occur during the stacking. In particular, when an inorganic filler, etc., is added, voids may remain inside the configuration after the stacking. When producing single-sided metal clad laminates, a detachable film, such as a fluorine resin film, etc., can be applied on the resin surface that does not have the metal layer 42 attached, so that the metal clad laminates may be detached for use after the stacking and molding procedures.

When manufacturing a multi-layer metal clad laminate, the insulating sheets, formed by stacking a liquid crystal polyester resin into inorganic or organic fiber reinforcement materials, can be hot pressed onto a metal core substrate 32. Also, when low CTE metal foils are used for the circuit metal layers, the insulating sheets formed by impregnating a liquid crystal polyester resin into inorganic or organic fiber reinforcement materials can be used. Furthermore, a multi-layer printed circuit board can also be manufactured using combinations of B-stage insulating sheets and layers of a prepreg, obtained by impregnating a resin composition other than a liquid crystal polyester resin composition, into an organic reinforcement material, inorganic reinforcement material, or an organic/inorganic mixed reinforcement material, to provide a double-sided printed circuit board. Of course, layers of liquid crystal polyester film can also be included in the combinations. However, it can be advantageous to keep the coefficient of thermal expansion of the printed circuit board at or below 9 ppm/° C.

The prepreg, B-stage insulating sheets, and double-sided printed circuit board used in a multi-layer printed circuit board according to this embodiment can be such that are known to those skilled in the art. One or more types of thermosetting resins, thermoplastic resins, UV-curable resins, and unsaturated-group-containing resins may generally be used. The thermosetting resin can be of any type known to those skilled in the art, For example, epoxy resin, cyanate ester resin, bismaleimide resin, polyimide resin, functional-group-containing polyphenylene ether resin, cardo resin, benzocyclobutene resin, and phenol resin, etc., can be used alone or in a mixture of two or more resins.

A cyanate ester resin may be utilized to prevent migration between through-holes or circuits. In addition, types of resin known to those skilled in the art, some of which have been listed above, may be used after applying flame-retardant treatment with phosphorus or bromine. While a thermosetting resin according to this embodiment can be cured by heating the resin as is, this may entail a slow curing rate and low productivity. Thus, an adequate amount of curing agent or thermosetting catalyst may advantageously be used in the thermosetting resin.

Various additives may generally be used in the thermosetting resin. For example, a thermosetting resin, a thermoplastic resin, or another type of resin may be added, other than the main resin used, as well as adequate amounts of an organic or inorganic filler, a dye, pigments, a thickening agent, lubricant, an antifoaming agent, a dispersing agent, leveling agent, brightening agent, and thixotropic agent, etc., according to the purpose or usage of the composition. It is also possible to use a flame retardant, such as those using phosphorus and bromine, and non-halogenated types.

A thermoplastic resin suitably used in the prepreg, etc., of this embodiment can be of any type known to those skilled in the art, including those other than the liquid crystal polyester resin over which the reinforcement material is stacked. Specific examples may include liquid crystal polyester resin, polyurethane resin, polyamide-imide resin, polyphenylene ether resin, etc. One or more of such resins may also be used in combination with a thermosetting resin. An adequate amount of various additives mentioned above may be added to the resin composition.

Besides the thermosetting resin and thermoplastic resin, other resins may be used alone or in combination, such as UV-curable resins and radical-curable resins, etc. Also, a photopolymerization initiator or radical polymerization initiator, for facilitating the forming of bridged bonds, and/or the various additives described above can be mixed in adequate amounts.

In terms of the reliability of the printed circuit board according to an embodiment of the invention, it may be advantageous to manufacture a multi-layer printed circuit board using combinations of insulating sheets and double-sided printed circuit boards made from thermosetting resins and heat-resistant thermoplastic resins, and insulating sheets made by stacking liquid crystal polyester resins over inorganic or organic fiber reinforcement materials.

As described above, insulating sheets formed by stacking a liquid crystal polyester resin stacked over an inorganic or organic fiber reinforcement material 10, according to certain embodiments of the invention, as well as printed circuit boards manufactured using such insulating sheets, can be used in various combinations, in correspondence to the purpose or the desired coefficient of thermal expansion of the printed circuit board.

For example, in the case of a multi-layer printed circuit board for high-frequency uses, liquid crystal polyester resin layers can be arranged in layers for transferring such signals, while epoxy resin layers, cyanate ester resin layers, etc., can be arranged in the other layers.

Conversely, in the case of a low CTE multi-layer printed circuit board, an overall coefficient of thermal expansion of 9 ppm/° C. or lower may be required. To this end, a double-sided printed circuit board having a coefficient of thermal expansion of 9 ppm/° C. or lower may be used in the inner core, while insulating sheets having a coefficient of thermal expansion of 9 ppm/° C. or lower, formed by stacking liquid crystal polyester resin layers over inorganic or organic fiber reinforcement materials 10, may be used also in the build-up layers.

Next, as illustrated in FIG. 11, circuit patterns 40 and lands 50 for mounting a semiconductor chip 90 can be formed in the metal layers 42, and the circuit patterns 40 formed on both sides of the insulating sheet can be electrically connected by vias 70. Solder resists 60 can also be coated on to protect the circuit patterns 40.

In certain examples, the metal layers 42 for signal transfer and the solder resist layers 60 covering the circuit patterns 40 on the outermost layer may also be made respectively from metal layers and liquid crystal polyester films or insulating sheets, e.g. formed by stacking liquid crystal polyester resin over a reinforcement material of inorganic or organic fibers according to an embodiment of the invention, that have coefficients of thermal expansion equal to or lower than 9 ppm/° C. Examples of methods for forming the circuit patterns 40 in the multi-layer printed circuit board may include subtractive methods and semi-additive methods, etc.

Next, as illustrated in FIG. 13, on either side of the printed circuit board thus manufactured, one or more insulating sheets that include thermoplastic resin layers 20 stacked over reinforcement materials 10 according to an embodiment of the invention can be stacked as build-up layers, and metal layers can be arranged over the outermost layers, after which hot pressing can be performed for the configuration to form a multi-layer printed circuit board.

The multi-layer printed circuit board of this embodiment can be manufactured to have a coefficient of thermal expansion similar to that of the semiconductor chip 90. Thus, bending or warpage in the printed circuit board can be prevented, and excessive stresses in the connecting material between the semiconductor chip and the printed circuit board can be avoided. As such, cracking or delamination in the semiconductor chip or the lead-free solder bumps, etc., may not occur, and highly reliable connections may be obtained.

The coefficients of thermal expansion of the insulating sheets, formed according to an embodiment of the invention by stacking a liquid crystal polyester resin over reinforcement materials of inorganic or organic fibers, may be 9 ppm/° C. or lower. In certain embodiments, the coefficient of thermal expansion may be −20 to 7 ppm/° C., and in some embodiments, −15 to 5.5 ppm/° C. Such materials can be placed over at least one side of a metal core substrate, and can be stacked and molded to manufacture a double-sided printed circuit board. This double-sided printed circuit board can in turn be used in combination with the insulating sheets to manufacture a multi-layer printed circuit board.

Since the coefficient of thermal expansion of a semiconductor chip mounted on a printed circuit board is generally very low, being about 2 to 3 ppm/° C., it can be advantageous to manufacture the printed circuit board such that its coefficient of thermal expansion is as close as possible to the coefficient of thermal expansion of the semiconductor, especially in the case of thin printed circuit boards.

A large difference in the coefficients of thermal expansion between the semiconductor chip and the printed circuit board can lead to bending or warpage after the semiconductor chip is mounted and connected, and thus can result in a defect. A large difference in the coefficients of thermal expansion can also increase the likelihood of defects resulting from stresses generated by temperature changes, such as cracking and delamination in the lead-free bumps for connecting the semiconductor chip and the printed circuit board, as well as damage in the semiconductor chip.

With an embodiment of the invention, however, a double-sided or a multi-layer printed circuit board can be manufactured that has a coefficient of thermal expansion close to that of the semiconductor chip, to greatly reduce bending or warpage in the printed circuit board and prevent delamination or cracking in the connecting material or semiconductor chip. Also, since there is no need for an underfill resin in the connecting material between the printed circuit board and the semiconductor chip, it may be possible to rework a faulty component, for greater benefits in terms of cost.

A double-sided or multi-layer printed circuit board according to an embodiment of the invention can be a printed circuit board suited for mounting a semiconductor chip, but it is apparent that wire bonding may also be used. In such cases, instead of forming the pads at the lower portion of the semiconductor chip, the pads may be formed on the outermost layer for wire bonding connection. Of course, it is possible to connect a semiconductor chip in one or either side.

In order to manufacture the printed circuit board to have a superb heat-releasing structure, the lands 50 on which to mount the semiconductor chip 90 can be connected by way of blind vias 70 to the core substrate 32, and the reverse side of the core substrate 32 can in turn be connected by vias 70 to the heat-releasing lands 50 on the lower side. When using the core substrate 32 for heat release, the heat generated in an operating semiconductor chip 90 may first be transferred to the core substrate 32, and afterwards the heat may be conducted through the reverse sides or the edges to another cooling object, such as the main board.

A metal core printed circuit board according to an embodiment of the invention can be a printed circuit board suited for mounting a semiconductor chip, but it is apparent that wire bonding may also be used. Of course, it is possible to connect a semiconductor chip in one or either side.

Figure 15:
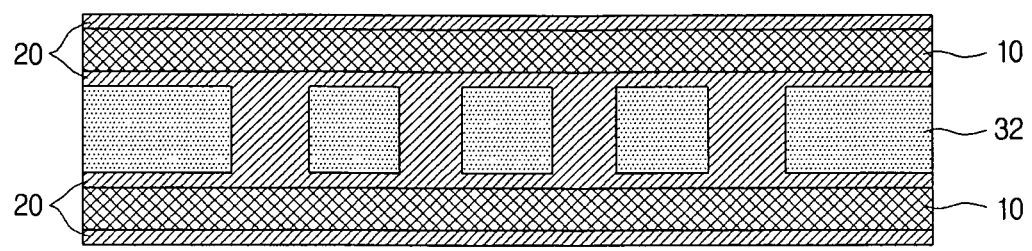
FIG. 15 is a cross sectional view of an insulating sheet according to an embodiment of the invention.
Figure 16:
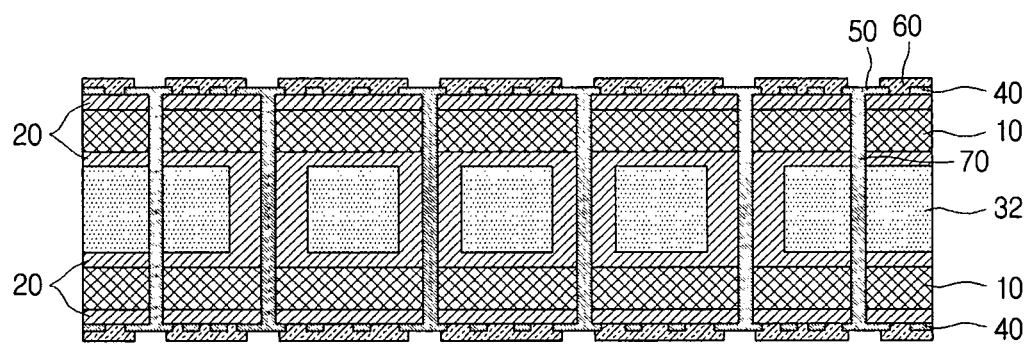
FIG. 16 is a cross sectional view of a printed circuit board according to an embodiment of the invention.

FIG. 15 is a cross sectional view of an insulating sheet according to an embodiment of the invention, and FIG. 16 is a cross sectional view of a printed circuit board according to an embodiment of the invention. In FIGS. 15 and 16, there are illustrated reinforcement materials 10, thermoplastic resin layers 20, a core substrate 32, circuit patterns 40, lands 50, solder resists 60, and vias 70.

The coefficient of thermal expansion of the reinforcement material 10 in the longitudinal and lateral directions can be within a range of −20 to 9 ppm/° C. The reinforcement material 10 can be formed from woven or non-woven fabric made of organic or inorganic fibers. The organic fibers are not limited to particular types, and may include, for example, aromatic polyamide fibers, polybenzoxazole fibers, liquid crystal polyester fibers, etc., formed into a woven or non-woven fabric. The inorganic fibers are not limited to particular types either, and may include, for example, E-glass, D-glass, NE-glass, T- (S-) glass fibers, etc., formed into a woven or non-woven fabric.

The thermoplastic resin layer 20 can be stacked over at least one side of the reinforcement material 10. The thermoplastic resin layer 20 can have a coefficient of thermal expansion of −20 to 9 ppm/° C. in the longitudinal and lateral directions, and can be made, for example, from liquid crystal polyester resin. The thermoplastic resin layers 20 can be selected such that the fusion point of the reinforcement material 10 is higher than the fusion point of the thermoplastic resin layers 20.

The core substrate 32 can have the thermoplastic resin layer 20, on which the reinforcement material 10 may be stacked, formed over at least one side. The core substrate 32 can have a coefficient of thermal expansion within the range of −20 to 9 ppm/° C. in the longitudinal and lateral directions, and can be made, for example, from metals such as copper, iron, nickel, magnesium, cobalt, tungsten, titanium, aluminum, etc., or an alloy of such metals. It is also possible to use a nickel-iron type alloy or a nickel-iron-cobalt type alloy, etc. Vias 70 can be perforated in the core substrate 32, where plating layers can be formed in the vias 70 to electrically connect circuit patterns formed on both sides of the insulating sheet.

Manufacture Example 1

Low CTE Metal Layer for Use as Core Substrate (1) Layers of a 200 μm nickel-iron type alloy A were used (invar, CTE: 0.4 ppm/° C.).
(2) Layers of a laminate B were used (CTE: 1.5 ppm/° C.), in each of which 5 μm rolled copper foils were attached to both sides of a 200 μm layer of invar.

Manufacture Example 2

Liquid Crystal Polyester Resin for Use as Build-up Layers

Layers of a 25 μm liquid crystal polyester film D were prepared (product code: FA film, fusion point: 281° C., CTE: −5.0 ppm/° C., Kuraray Co., Ltd.).

Manufacture Example 3

Inorganic Fiber Reinforcement Material (1) Layers of a 50 μm T(S)-glass fiber woven fabric E were used (CTE: 2.8 ppm/° C.).

Manufacture Example 4

Low CTE Organic Fiber Reinforcement (1) Aromatic Polyamide Fabric
Layers of a 50 μm para-type polyamide fiber poly(p-phenylene-3,4'-oxydiphenylene terephthalamide) woven fabric F were used (CTE: −4.7 ppm/° C.).
(2) Liquid Crystal Polyester Fabric
Layers of a 50 μm liquid crystal polyester woven fabric G were used (fusion point: 301° C., CTE: −6.5 ppm/° C.).

Manufacture Example 5

Low CTE Organic Film Reinforcement Material (1) Polybenzoxazole Film
Layers of a 25 μm (poly-p-phenylene benzo-bis-oxazol) film H were used (CTE: −6.0 ppm/° C.).
(2) Liquid Crystal Polyester Film
Layers of a 25 μm liquid crystal polyester film I were used (fusion point: 306° C., CTE: −2.3 ppm/° C.).

Manufacture Example 6

Metal Layers Used in Forming Circuits for Signal Transfer (1) Layers of a 20 μm Ni—Fe based alloy J were used (invar, CTE: 0.4 ppm/° C.). A plasma treatment was applied to the surfaces, which will be referred to as metal layers J-1.
(2) Rolled copper foils of a 2 μm thickness were attached to both sides of a 20 μm invar layer, to obtain a laminate K (CTE: 3.3 ppm/° C.). A black oxide treatment was applied to the surfaces of these laminates, which will be referred to as metal layers K-1.

(3) Layers of an 18 μm electro-deposited copper foil L were used (CTE: 17 ppm/° C.).

Manufacture Example 7

Resin Composition Used in Forming Solder Resists (1) Layers of a 25 μm liquid crystal polyester resin sheet M were used (CTE: −5.0 ppm/° C.).
(2) Layers of product PSR4000AUS308 from Taiyo Ink Mfg. Co. were used as resin N (CTE: 59 ppm/° C.).
(3) Layers of a 30 μm epoxy resin sheet O, provided as product APL-3601A from Sumitomo Bakelite Co., Ltd., were used (CTE: 27 ppm/° C.).

Example 1

For the inorganic fiber reinforcement material E, the liquid crystal polyester resin sheets D were arranged on both sides, after which 50 μm fluorine resin films were placed on the outer sides, and 2 mm stainless steel plates were placed on the outer sides. The configuration was stacked at 293° C., with a pressure of 15 kgf/cm2, for 30 minutes in a 5 mmHg vacuum, to produce a build-up insulating sheet E-①.

Meanwhile, the metal layers A and B were processed as follows for use as low CTE metal core substrates.

Clearance holes of 150 μm were etched and processed into the metal layers A and B in sizes larger than those of the through-holes (50 μm) for interlayer conduction. A plasma treatment was applied to the surfaces of the metal layer A, the result of which will be referred to as A-1, while a black oxide treatment was applied to the surfaces of the metal layer B, to provide a metal plate B-1. The metal layers on the surfaces and the metal layer of the inner metal core substrate were processed with laser in correspondence to positions of three bumps that were to be formed in each corner (for a total of twelve) for connecting a semiconductor chip. The processed holes were used to directly connect the surface metal layers with the inner metal core substrate for heat release purposes.

These were used, according to the combination listed in Table 1-1, to produce metal clad laminates and printed circuit boards. To be more specific, after removing the fluorine detachable films, the insulating sheets E-① were arranged on both sides of each of metal layers A-1 and B-1, and metal layers J-1, K-1, and L were selectively arranged on the outer sides according to Table 1-1. Afterwards, the configurations were stacked and molded, to produce metal double-sided metal clad laminates P-①, P-②, P-③ having metal core substrates. To these double-sided metal clad laminates, through-holes of a 50 μm diameter were formed in the center of the clearance holes filled in with resin, and the through-holes were filled in with copper plating. Through-holes were processed and filled in with copper plating such that the portions in the corners where the twelve bumps for connecting the semiconductor chip were formed could be directly connected to the inner metal core substrate. The metal layers on the surfaces were etched until the total thickness of the metal layers and copper plating was 25 μm. Circuits were formed in the surfaces, and metal layers and solder resists were selectively used on the surfaces in accordance with Table 1-1. The metal layers were formed to a thickness of 15 μm for signal transfer. In such manner, double-sided printed circuit boards P-④, P-⑤, and P-⑤ having metal core substrates were produced. It is noted that the low CTE metal layers in the core portions can be used as power supply layers or grounding layers. Evaluation results are listed below in Table 1-1.

Example 2

For the organic fiber reinforcement material F, the liquid crystal polyester resin sheets D were arranged on both sides, after which 50 μm fluorine resin films were placed on the outer sides, and 2 mm stainless steel plates were placed on the outer sides. The configuration was stacked at 293° C., with a pressure of 15 kgf/cm2, for 30 minutes in a 5 mmHg vacuum, to produce a build-up insulating sheet F-①.

Meanwhile, the metal layers A and B were processed as follows for use as low CTE metal core substrates.

Clearance holes of 150 μm were etched and processed into the metal layers A and B in sizes larger than those of the through-holes (50 μm) for interlayer conduction. A plasma treatment was applied to the surfaces of the metal layer A, the result of which will be referred to as A-1, while a black oxide treatment was applied to the surfaces of the metal layer B, to provide a metal plate B-1. The metal layers on the surfaces and the metal layer of the inner metal core substrate were processed with laser in correspondence to positions of three bumps that were to be formed in each corner (for a total of twelve) for connecting a semiconductor chip. The processed holes were used to directly connect the surface metal layers with the inner metal core substrate for heat release purposes.

These were used, according to the combination listed in Table 1-2, to produce a metal clad laminate and a printed circuit boards. To be more specific, the same procedures as those of Example 1 were applied, using the insulating sheets F-①, to produce a metal double-sided metal clad laminate F-② having a metal core substrate. To this double-sided metal clad laminate, through-holes of a 50 μm diameter were formed in the center of the clearance holes filled in with resin, and the through-holes were filled in with copper plating. Through-holes were processed and filled in with copper plating such that the portions in the corners where the twelve bumps for connecting the semiconductor chip were formed could be directly connected to the inner metal core substrate. The metal layers on the surfaces were etched until the total thickness of the metal layers and copper plating was 25 μm. Circuits were formed in the surfaces, and metal layers and solder resists were selectively used on the surfaces in accordance with Table 1-2. The metal layers were formed to a thickness of 15 μm for signal transfer. In such manner, a double-sided printed circuit board F-③ having a metal core substrate was produced. It is noted that the low CTE metal layer in the core portion can be used as a power supply layer or a grounding layer. Evaluation results are listed below in Table 1-2.

Example 3

Except that the organic fiber reinforcement material G and insulating sheets G-① were used, the same method as in Example 2 was used to produce a double-sided printed circuit board G-③. Evaluation results are listed below in Table 1-2.

Example 4

Except that the organic film reinforcement material H and insulating sheets H-① were used, the same method as in Example 2 was used to produce a double-sided printed circuit board H-③. Evaluation results are listed below in Table 1-2.

Example 5

Except that the organic film reinforcement material I and insulating sheets I-① were used, the same method as in Example 2 was used to produce a double-sided printed circuit board I-③. Evaluation results are listed below in Table 1-2.

Example 6

A double-sided metal clad laminate having a metal core substrate produced in Example 1 was processed in the same manner as in Example 1, to produce an inner-layer printed circuit board having a metal core substrate. A black oxide treatment was applied to the surfaces of this printed circuit board, and the insulating sheets E-① were used on both sides, according to Table 2-1. Metal layers were arranged in the outermost layers, and the configuration was stacked and molded in the same manner to produce a four-layer metal clad laminate that includes a metal core substrate. Here, blind via holes of a 50 μm diameter were formed using UV-YAG laser, and after applying a plasma desmearing treatment, copper plating was filled in the holes. The copper plating portions on the surface layers were etched until the total thickness of the surface metal layers was 25 μm, and circuits were formed in the surfaces. A black oxide treatment was applied, after which the insulating sheets and metal layers were placed on both sides, and the procedures for stacking, processing blind via holes, desmearing, filling with copper plating, etching the copper in the surface layers, and forming circuits were repeated, to produce a six-layer printed circuit board. A resin composition was coated or stacked over both sides as solder resists, and a conventional method was applied, such as that using an alkaline developer, etc. Other portions were uncovered using UV-YAG laser and plasma etching was applied to provide a multi-layer printed circuit board P-⑧. Evaluation results are listed below in Table 2-1.

A semiconductor chip was mounted and connected to the double-sided or multi-layer printed circuit board that includes a metal core substrate by reflowing, using lead-free solder. The configuration was evaluated without using an underfill resin.

The method of connecting the semiconductor chip in the semiconductor plastic package is not limited to those described above, and may include various attachment methods known to those skilled in the art.

Furthermore, the method of manufacturing the printed circuit board used for the semiconductor plastic package is not limited to those described above, and may include various manufacturing methods known to those skilled in the art.

Example 7

A double-sided metal clad laminate having a metal core substrate produced in Example 2 was processed in the same manner as in Example 2, to produce an inner-layer printed circuit board having a metal core substrate.

Except that the insulating sheets F-① were used, the same method as in Example 6 was used to produce a multi-layer printed circuit board F-④

Example 8

A double-sided metal clad laminate having a metal core substrate produced in Example 3 was processed in the same manner as in Example 3, to produce an inner-layer printed circuit board having a metal core substrate.

Except that the insulating sheets G-① were used, the same method as in Example 6 was used to produce a multi-layer printed circuit board G-④

Example 9

A double-sided metal clad laminate having a metal core substrate produced in Example 4 was processed in the same manner as in Example 4, to produce an inner-layer printed circuit board having a metal core substrate.

Except that the insulating sheets H-① were used, the same method as in Example 6 was used to produce a multi-layer printed circuit board H-④

Example 10

A double-sided metal clad laminate having a metal core substrate produced in Example 5 was processed in the same manner as in Example 5, to produce an inner-layer printed circuit board having a metal core substrate.

Except that the insulating sheets I-① were used, the same method as in Example 6 was used to produce a multi-layer printed circuit board I-④

Comparative Example 1

A double-sided copper clad laminate Q-② (product code: CCL-HL830, Mitsubishi Gas Chemical Company, Inc.) was used that includes a 100 μm E-glass woven fabric as the reinforcement material and two 100 μm prepreg layers made of bismaleimide•cyanate ester resin and epoxy resin, and 18 μm electro-deposited copper layers were arranged on both sides as the metal layers. The procedures for forming through-holes, desmearing, and copper plating were performed in the same manner as in the Examples, to form circuits. Solder resist were formed on the outermost layers to produce a double-sided printed circuit board Q-③. A conventional alkaline development type UV solder resist N was used, by a method known to those skilled in the art, to produce the double-sided printed circuit board Q-③. Also, a black oxide treatment was applied to the inner core printed circuit board obtained using Q-②, and one layer of a 60 μm build-up prepreg Q-① (product code: GHPL-830 MBH, Mitsubishi Gas Chemical Company, Inc.) was placed on either side, and 18 μm electro-deposited copper foils were arranged on the outer sides. The configuration was stacked at 190° C., with a pressure of 20 kgf/cm2, for 90 minutes in a 5 mmHg vacuum, to produce a four-layer double-sided printed circuit board. The procedures were repeated in the same manner to produce a six-layer printed circuit board Q-④. A conventional alkaline development type UV solder resist N was used for the solder resists. Evaluation results are listed below in Table 1-3 and Table 2-2.

Comparative Example 2

For a 200 μm aromatic polyamide non-woven fabric (CTE: −0.2 ppm/° C.) used as the reinforcement material, epoxy resin was attached as the resin layers, to produce an insulating sheet R-① for forming a copper clad laminate. Using 18 μm electro-deposited copper foils as the metal layers, the configuration was stacked and molded at 175° C., with a pressure of 25 kgf/cm2, for 60 minutes in a 5 mmHg vacuum, to produce a double-sided copper clad laminate R-②. This was used, in the same manner as described above, to produce a double-sided printed circuit board R-③. Also, a 50 μm aromatic polyamide non-woven fabric and epoxy resin were attached to produce a 60 μm insulating sheet RX-①. These were used to produce a six-layer printed circuit board R-④. A conventional alkaline development type UV solder resist N was used for the solder resists. Evaluation results are listed below in Table 1-3 and Table 2-2.

Comparative Example 3

For a 100 μm E-glass woven fabric used as the reinforcement material, layers of a 50 μm liquid crystal polyester resin film (product code: BIAC, fusion point 335° C., CTE: 17.1 ppm/° C., Gore-Tex Japan) were arranged on both sides, after which 50 μm fluorine resin films were placed on the outer sides, and 2 mm stainless steel plates were placed on the outer sides. The configuration was stacked and molded at 330° C., with a pressure of 25 kgf/cm2, for 30 minutes in a 5 mmHg vacuum, to produce a prepreg S-①. On both sides of this prepreg, 18 μm copper foils were arranged, and the configuration was stacked and molded in the same manner to produce a double-sided copper clad laminate S-②. This copper clad laminate was used, in the same manner as described above, to produce a double-sided printed circuit board S-③. Also, for a 40 μm E-glass woven fabric, 25 μm layers of the liquid crystal polyester resin film were arranged on both sides, and the configuration was stacked in the same manner to produce an insulating sheet SY-①. Layers of this sheet were used to produce a multi-layer printed circuit board S-④. A conventional alkaline development type UV solder resist N was used for the solder resists. Evaluation results are listed below in Table 1-3 and Table 2-2.

Comparative Example 4

For Comparative Example 1, a 200 μm copper layer was prepared instead of the double-sided copper clad laminate Q-②, and through-holes of through-holes of a 150 μm diameter were formed by etching. After applying a black oxide treatment on the copper layer, one layer of the prepreg Q-① was arranged on either side, and 18 μm electro-deposited copper layers were arranged on both outer sides. The configuration was stacked at 190° C., with a pressure of 20 kgf/cm2, for 90 minutes in a 5 mmHg vacuum, to produce a double-sided copper clad laminate T-②. This was processed in the same manner as in Example 1, to produce a double-sided printed circuit board T-③ having a metal core substrate. Also, using an inner printed circuit board having a metal core substrate, a black oxide treatment was applied on the surfaces, one layer of the prepreg Q-① was arranged on either side. and 18 μm electro-deposited copper layers were arranged on both outer sides. The configuration was stacked and molded in the same manner as described above to produce a four-layer copper clad laminate, which was processed in the same manner as in Example 1. The stacking, molding, and processing procedures were performed in the same manner as described above, to produce a six-layer printed circuit board T-④.

A conventional alkaline development type UV solder resist N was used for the solder resists. The heat-releasing vias were not connected to the copper of the core layer. Evaluation results are listed below in Table 1-3 and Table 2-2.

TABLE 1-1

|  | Example 1-1 | Example 1-2 | Example 1-3 |
|---|---|---|---|
| Metal Core Substrate | B-1 | A-1 | A-1 |
| Reinforcement Material | E | E | E |
| Insulation Sheet on Metal Core Substrate | E-□ | E-□ | E-□ |
| Metal Layer for Circuitry | J-1 | K-1 | L |
| Solder Resist | O | O | M |
| Double-Sided Printed Circuit Board | P-□ | P-□ | P-□ |
| CTE of Double-Sided Printed Circuit Board (ppm/° C.) | 4.4 | 3.9 | 0.6 |
| Bending/Warpage after Mounting Semiconductor Chip (μm) | 30 | 23 | 24 |
| Faultless Products after Thermal Shock Test (n/100 samples) | 100/100 | 100/100 | 100/100 |
| Heat Release Performance (° C.) | <40 | <40 | <40 |

TABLE 1-2

|  | Example 2 | Example 3 | Example 4 | Example 5 |
|---|---|---|---|---|
| Metal Core Substrate | A-1 | A-1 | B-1 | B-1 |
| Reinforcement Material | F | G | H | I |
| Insulation Sheet on Metal Core Substrate | F-□ | G-□ | H-□ | I-□ |
| Metal Layer for Circuitry | I-1 | J-1 | K | I-1 |
| Solder Resist | M | O | O | O |
| Double-Sided Printed Circuit Board | F-□ | G-□ | H-□ | H-□ |
| CTE of Double-Sided Printed Circuit Board (ppm/° C.) | −1.1 | 2.9 | 4.2 | 4.4 |
| Bending/Warpage after Mounting Semiconductor Chip (μm) | 20 | 25 | 54 | 12 |
| Faultless Products after Thermal Shock Test (n/100 samples) | 100/100 | 100/100 | 100/100 | 100/100 |
| Heat Release Performance (° C.) | <40 | <40 | <40 | <40 |

TABLE 1-3

|  | Comparative Example 1-1 | Comparative Example 2-1 | Comparative Example 3-1 | Comparative Example 4-1 |
|---|---|---|---|---|
| Reinforcement Material | E-glass Woven Fabric 100 μm, 2 Layers | Aromatic Polyamide Non-Woven Fabric 200 μm | E-glass Woven Fabric 100 μm | Copper Layer 200 μm |
| Double-Sided Copper Clad Laminate | Commercially available CCL Q-□ | R-□ | S-□ | T-□ |
| Metal Layer for Circuitry | L | L | L | L |
| Solder Resist | N | N | N | N |
| Double-Sided Printed Circuit Board | Q-□ | R-□ | S-□ | T-□ |
| CTE of Double-Sided Printed Circuit Board (ppm/° C.) | 22.5 | 16.1 | 21.2 | 21.9 |

TABLE 1-3-continued

|  | Comparative Example 1-1 | Comparative Example 2-1 | Comparative Example 3-1 | Comparative Example 4-1 |
|---|---|---|---|---|
| Bending/Warpage after Mounting Semiconductor Chip (μm) | 688 | 472 | 597 | 675 |
| Faultless Products after Thermal Shock Test (n/100 samples) | 0/100 | 17/100 | 2/100 | 0/100 |
| Heat Release Performance (° C.) | 50< | 50< | 50< | 46 |

TABLE 2-1

|  | Example 6 | Example 7 | Example 8 | Example 9 | Example 10 |
|---|---|---|---|---|---|
| Metal Core Substrate | A-1 | A-1 | A-1 | B-1 | B-1 |
| Build-Up Insulation Sheet | E-☐ | F-☐ | G-☐ | H-☐ | I-☐ |
| Metal Layer for Circuitry | L | J-1 | K-1 | L | L |
| Solder Resist | M | N | N | N | O |
| Six-Layer Printed Circuit Board | P-☐ | F-☐ | G-☐ | H-☐ | I-☐ |
| CTE of Six-Layer Printed Circuit Board (ppm/° C.) | −0.6 | 3.0 | 2.7 | 4.4 | 2.6 |
| Bending/Warpage after Mounting Semiconductor Chip (μm) | 18 | 7 | 6 | 42 | 16 |
| Faultless Products after Thermal Shock Test (n/100 samples) | 100/100 | 100/100 | 100/100 | 100/100 | 100/100 |
| Heat Release Performance (° C.) | <40 | <40 | <40 | <40 | <40 |

TABLE 2-2

|  | Comparative Example 1-2 | Comparative Example 2-2 | Comparative Example 3-2 | Comparative Example 4-2 |
|---|---|---|---|---|
| Copper Clad Laminate Core | Q-☐ | R-☐ | S-☐ | T-☐ |
| Build-Up Insulation Sheet | Commercially Available Prepreg Q-☐ | RX-☐ | SY-☐ | Q-☐ |
| Metal Layer for Circuitry | L | L | L | L |
| Solder Resist | N | N | N | N |
| Six-Layer Printed Circuit Board | Q-☐ | R-☐ | S-☐ | T-☐ |
| CTE of Six-Layer Printed Circuit Board (ppm/° C.) | 19.7 | 11.6 | 16.5 | 20.0 |
| Bending/Warpage after Mounting Semiconductor Chip (μm) | 502 | 229 | 478 | 564 |
| Faultless Products after Thermal Shock Test (n/100 samples) | 6/100 | 43/100 | 16-100 | 4/100 |
| Heat Release Performance (° C.) | 50< | 50< | 50< | 50< |

[Measurement Method]

(1) Coefficient of Thermal Expansion

Values were measured using TMA. The values were recorded for 25 to 150° C.

(2) Bending and Warpage

One semiconductor chip having lead-free solder bumps, with dimensions of 10×10 mm and formed to a thickness of 400 μm, was connected to the center of a 40×40 mm printed circuit board. For one hundred such semiconductor plastic packages, none of which includes underfill resin between the semiconductor chip and the printed circuit board, the bending and warpage were measured using a laser measurement apparatus. The printed circuit boards were selected and measured which initially displayed bending and warpage of 50±5 μm. The maximum values of bending and warpage were measured again using a laser measurement apparatus after mounting and connecting the semiconductor chip, and the maximum increase was recorded.

(3) Thermal Shock Test

One hundred semiconductor plastic packages produced in the same manner as described above were subject to temperature cycle tests, in which the temperature was maintained at −60° C. for 30 minutes and then at 150° C. for 30 minutes for one cycle. After 1000 cycles, the integrity of the electrical connection between the semiconductor chip and the printed circuit board was evaluated. A change in resistance value of ±15% or more was classified as a defect. The samples were also checked for damage in the semiconductor chip and cracking and delamination in the solder. The number of flawless products was recorded as the numerator.

(4) Heat Release Performance

The semiconductor plastic package was connected to a main board using lead-free solder. The semiconductor chip was operated until the temperature of the semiconductor chip reached 85° C., at which time the operation was stopped. The temperature of the semiconductor chip was measured after a duration of 10 minutes.

As set forth above, an insulating sheet and a method of manufacturing the insulating sheet, as well as a printed circuit board using the insulating sheet and a method of manufacturing the printed circuit board, according to certain embodiments of the invention can be utilized to produce an insulation board that has a coefficient of thermal expansion close to that of the semiconductor chip, and thereby prevent bending or warpage in the printed circuit board using the insulation board. Furthermore, the stress in the material connecting the semiconductor chip with the printed circuit board can be reduced, so that cracking or delamination in the connecting material, such as lead-free solder, may be avoided. Also, certain embodiments of the invention can be utilized in manufacturing a semiconductor plastic package that provides superb heat-releasing performance.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing an insulating sheet, the method comprising:
   providing a reinforcement material having a thermoplastic resin layer stacked thereon;
   stacking the thermoplastic resin layer stacked on the reinforcement material over a core substrate; and
   hot pressing the reinforcement material and the thermoplastic resin layer onto the core substrate at a temperature higher than the fusion point of the thermoplastic resin layer by 10 to 50° C. in a vacuum environment.

2. The method of claim 1, wherein the core substrate has a coefficient of thermal expansion within a range of −20 to 9 ppm/° C. in longitudinal and lateral directions.

3. The method of claim 1, wherein the core substrate includes any one or more selected from a group consisting of copper, iron, nickel, magnesium, cobalt, tungsten, titanium, and aluminum.

4. The method of claim 1, wherein the reinforcement material has a coefficient of thermal expansion within a range of −20 to 9 ppm/° C. in longitudinal and lateral directions.

5. The method of claim 1, wherein the reinforcement material includes organic fibers or inorganic fibers.

6. The method of claim 5, wherein the organic fibers include any one selected from a group consisting of aromatic polyamide fibers, polybenzoxazole fibers, and liquid crystal polyester fibers.

7. The method of claim 5, wherein the inorganic fibers include glass fibers.

8. The method of claim 1, wherein the thermoplastic resin layer has a coefficient of thermal expansion within a range of −20 to 9 ppm/° C. in longitudinal and lateral directions.

9. The method of claim 1, wherein the thermoplastic resin layer includes liquid crystal polyester resin.

10. The method of claim 1, wherein the reinforcement material has a fusion point higher than that of the thermoplastic resin layer.

11. The method of claim 1, further comprising, before the stacking of the thermoplastic resin layer:
    selectively perforating at least one through-hole in the core substrate.

12. A method of manufacturing a printed circuit board, the method comprising:
    providing a reinforcement material having a thermoplastic resin layer stacked on either side thereof;
    stacking the thermoplastic resin layer stacked on either side of the reinforcement material over a core substrate;
    hot pressing the reinforcement material and the thermoplastic resin layers onto the core substrate at a temperature higher than the fusion point of the thermoplastic resin layer by 10 to 50 ° C. in a vacuum environment; and
    forming a circuit pattern over the exposed thermoplastic resin layer.

13. The method of claim 12, wherein the core substrate has a coefficient of thermal expansion within a range of −20 to 9 ppm/° C. in longitudinal and lateral directions.

14. The method of claim 12, wherein the core substrate includes any one or more selected from a group consisting of copper, iron, nickel, magnesium, cobalt, tungsten, titanium, and aluminum.

15. The method of claim 12, wherein the reinforcement material has a coefficient of thermal expansion within a range of −20 to 9 ppm/° C. in longitudinal and lateral directions.

16. The method of claim 12, wherein the reinforcement material includes organic fibers or inorganic fibers.

17. The method of claim 16, wherein the organic fibers include any one selected from a group consisting of aromatic polyamide fibers, polybenzoxazole fibers, and liquid crystal polyester fibers.

18. The method of claim 16, wherein the inorganic fibers include glass fibers.

19. The method of claim 12, wherein the thermoplastic resin layers have coefficients of thermal expansion within a range of −20 to 9 ppm/° C. in longitudinal and lateral directions.

20. The method of claim 12, wherein the thermoplastic resin layers include liquid crystal polyester resin.

21. The method of claim 12, wherein the reinforcement material has a fusion point higher than those of the thermoplastic resin layers.

22. The method of claim 12, further comprising, before the stacking of the thermoplastic resin layer:
    selectively perforating at least one through-hole in the core substrate.

* * * * *

UNITED STATES PATENT AND TRADEMARK OFFICE
CERTIFICATE OF CORRECTION

| | | |
|---|---|---|
| PATENT NO. | : 8,997,340 B2 | Page 1 of 1 |
| APPLICATION NO. | : 13/137936 | |
| DATED | : April 7, 2015 | |
| INVENTOR(S) | : Keungjin Sohn et al. | |

It is certified that error appears in the above-identified patent and that said Letters Patent is hereby corrected as shown below:

On the Title Page, Item [54] and in the Specification, Column 1, in the Title, line 1, delete "and" and insert -- an --, therefor.

Signed and Sealed this
Twenty-third Day of June, 2015

Michelle K. Lee
*Director of the United States Patent and Trademark Office*